(12) United States Patent
Mali et al.

(10) Patent No.: US 12,114,571 B2
(45) Date of Patent: Oct. 8, 2024

(54) CLAMP APPARATUS FOR ENERGY HARVESTING

(71) Applicant: Sensia LLC, Houston, TX (US)

(72) Inventors: Girish S. Mali, Nashua, NH (US); Burt Sacherski, Nashua, NH (US)

(73) Assignee: SENSIA LLC, Houston, TX (US)

( * ) Notice: Subject to any disclaimer, the term of this patent is extended or adjusted under 35 U.S.C. 154(b) by 603 days.

(21) Appl. No.: 16/580,809

(22) Filed: Sep. 24, 2019

(65) Prior Publication Data
US 2021/0050501 A1    Feb. 18, 2021

Related U.S. Application Data

(60) Provisional application No. 62/886,688, filed on Aug. 14, 2019.

(51) Int. Cl.
| H10N 10/80 | (2023.01) |
| H01L 25/10 | (2006.01) |
| H10N 10/17 | (2023.01) |
| H10N 10/817 | (2023.01) |

(52) U.S. Cl.
CPC ............. *H10N 10/80* (2023.02); *H01L 25/10* (2013.01); *H10N 10/17* (2023.02); *H10N 10/817* (2023.02)

(58) Field of Classification Search
None
See application file for complete search history.

(56) References Cited

U.S. PATENT DOCUMENTS

| 2013/0213448 A1* | 8/2013 | Moczygemba | ......... H01L 35/32 |
| | | | 136/201 |
| 2014/0326287 A1* | 11/2014 | Wiant | ..................... H01L 35/30 |
| | | | 136/205 |

FOREIGN PATENT DOCUMENTS

| FR | 2427690 A1 * | 12/1979 | ............. H01L 35/02 |
| JP | 2019090640 A | 6/2019 | |

* cited by examiner

*Primary Examiner* — Dustin Q Dam
(74) *Attorney, Agent, or Firm* — Foley & Lardner LLP

(57) ABSTRACT

A mobile clamp attaches to a steam pipe and converts thermal energy to electric energy. One side of the clamp is generally open to allow for insertion of the steam pipe. During insertion, opposing blocks on either side of the clamp are deflected apart. Each block includes a curved channel extending along the length of the block to receive the steam pipe. Fitting the steam pipe within the channel aligns the clamp on the steam pipe. A biasing force applied to the blocks to return each block to an initial position provides a clamping force on the steam pipe to positively retain the clamp on the pipe. Thermoelectric devices are mounted on the blocks to convert the thermal energy into electrical energy. Thermal energy is transmitted from the steam, through the steam pipe, through the block pressed against the steam pipe, and to the thermoelectric device.

17 Claims, 5 Drawing Sheets

CLAMP APPARATUS FOR ENERGY HARVESTING

CROSS-REFERENCE TO RELATED APPLICATIONS

This application claims priority to U.S. Provisional Application Ser. No. 62/886,688, filed Aug. 14, 2019, the entire contents of which is incorporated herein by reference.

BACKGROUND INFORMATION

The subject matter disclosed herein relates to a clamp member used to harvest energy from a heat source. More specifically, a mobile clamp is configured to be attached to a steam pipe, where the mobile clamp includes thermoelectric devices to convert thermal energy in the steam to electric energy.

Although the utility power grid is widely available to supply power, the power grid is only developed in regions where there is sufficient population density to support the investment in the infrastructure. In remote locations, the cost of the infrastructure required to transport power and, in some instances, the lack of other infrastructure, such as roads, water, and the like for use in installation and commissioning of the utility grid make it impractical to supply power to all locations.

As is known to those skilled in the art, energy generation in remote locations may be achieved through alternate energy sources, such as wind turbines, solar power, stand-alone generators and the like. However, these energy sources are not without their drawbacks. Alternate energy sources, such as wind and solar are dependent on variable weather conditions for energy production. Stand-alone generators require periodic delivery of a fuel supply, such as propane or diesel fuel. Additionally, certain applications require only a small amount of energy and it is impractical to install an alternate energy source to supply the power requirements for the application.

In an oil field, steam may be used as part of the oil extraction process. Pipes may be run over extensive regions to deliver the steam to the desired locations. The oil field itself may be in a remote location. While a central facility, housing, for example, a steam generator, processing facilities, and/or controls for the oil field may be connected to the grid, utilize an alternate energy source, utilize a stand-alone generator, or a combination thereof to provide energy to the central facility, it may be impractical to supply power throughout the oil field.

In the field, it may be desirable, for example, to obtain information about the pressure and/or flow rate of steam within the steam pipes. Sensors may be distributed throughout the field to obtain these measurements and wireless transmitters may be provided to communicate the information back to a central facility. However, neither the sensors nor the wireless transmitters require a significant amount of energy. Additionally, the intervals at which they are spaced apart make it impractical to connect a central power source to each sensor.

Presently, it is known to provide batteries to supply power to the sensors and wireless transmitters. However, the batteries require periodic replacement and maintenance. Thus, it would be desirable to provide an improved power source for remotely located electronic devices.

BRIEF DESCRIPTION

The subject matter disclosed herein describes an improved power source for remotely located electronic devices. A mobile clamp is configured to be attached to a steam pipe, where the mobile clamp includes thermoelectric devices to convert thermal energy in the steam to electric energy. One side of the clamp is generally open to allow for insertion of the steam pipe within the clamp. A handle is provided on the clamp, by which an operator may lift the clamp and press-fit the clamp over the steam pipe. During insertion of the steam pipe, opposing blocks on either side of the clamp are deflected apart. Each block includes a curved channel extending along the length of the block in which the steam pipe rests. After the initial deflection of each block, the blocks are biased to return toward the pipe as the pipe fits within the curved channel. The blocks may be biased, for example, by one or more springs connected between the blocks or by a resilient nature of the material from which the block is constructed. Fitting the steam pipe within the channel extending along each block facilitates alignment of the clamp on the steam pipe. Further, the force applied by the springs, or by the resilient material, to return each block to an initial position provides a clamping force on the steam pipe to positively retain the clamp on the pipe.

Thermoelectric devices are mounted on the mobile clamp to convert thermal energy from the steam into electrical energy. The thermoelectric devices may be mounted to each block, where each block is made from a thermally conductive material. The thermal energy is transmitted from the steam into the steam pipe and, in turn, through the block pressed against the steam pipe to the thermoelectric device. The clamp may also include a thermal interface material. The thermal interface material may be integrally formed on the thermoelectric device or may be a separate material inserted between the block and the thermoelectric device to improve heat transfer between the two devices. Additionally, a heat sink may be mounted to the opposite side of the thermoelectric device to assist in heat dissipation from the side of the device positioned away from the steam pipe and to increase the thermal gradient across the device thereby increasing generation of electrical energy. A thermal interface material may similarly be provided between the thermoelectric device and the heat sink to improve thermal transfer between the two devices.

According to a first embodiment of the invention, a system for harvesting energy from a thermal source is disclosed. The system includes a frame having a width, a depth, a length, and an open side. The open side is configured to receive an elongated object within the frame, and the frame extends longitudinally along the elongated object for the length of the frame. The system also includes a first block extending longitudinally for at least a portion of the length of the frame and a second block extending longitudinally for at least a portion of the length of the frame. At least one thermoelectric device is mounted to either the first block or the second block. The first block and the second block operatively engage the elongated object when the elongated object is inserted within the frame to positively retain the frame to the elongated object, and the at least one thermoelectric device is operative to generate electric energy from thermal energy present within the elongated object.

According to another embodiment of the invention a system for harvesting energy includes a frame having a first side and a generally open side opposite the first side. The open side is configured to receive an elongated object within the frame. The system also includes a first block pivotally mounted along a first edge of the first side of the frame and a second block pivotally mounted along a second edge of the first side of the frame. The first block includes an inner surface and an outer surface, and the second block includes an inner surface and an outer surface. The inner surfaces of the first block and the second block engage the elongated object when it is inserted within the frame. A first thermoelectric device is mounted to the outer surface of the first block, and a second thermoelectric device is mounted to the outer surface of the second block. The first thermoelectric device and the second thermoelectric device are each operative to generate electric energy from thermal energy present within the elongated object.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
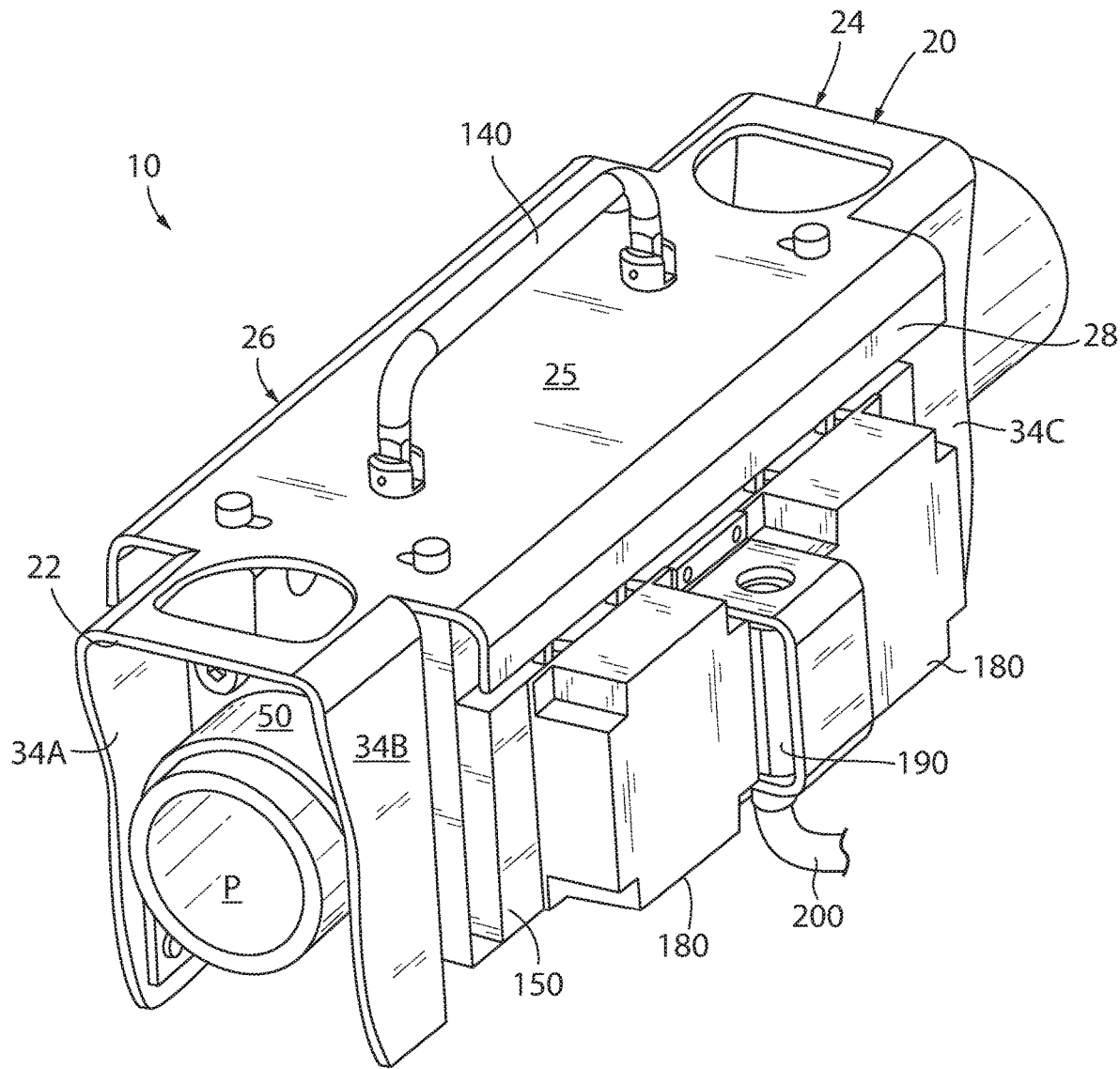
FIG. 1 is a perspective view from the front, side, and top of a clamp apparatus for harvesting energy according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Certain relational terms, such as upper, lower, left, right, top, bottom, front, back, and the like may be used herein. It is understood that unless specifically indicated these terms are not intended to be limiting. Rather, the terms are used with respect to an object located within one of the figures and are intended to provide a relation between the object and other objects within the figure. The terms are used to facilitate understanding of the drawings. The object may be rotated in a vertical plane, horizontal plane, or combinations thereof, changing the relational term between two objects without deviating from the scope of the invention.

Figure 2:
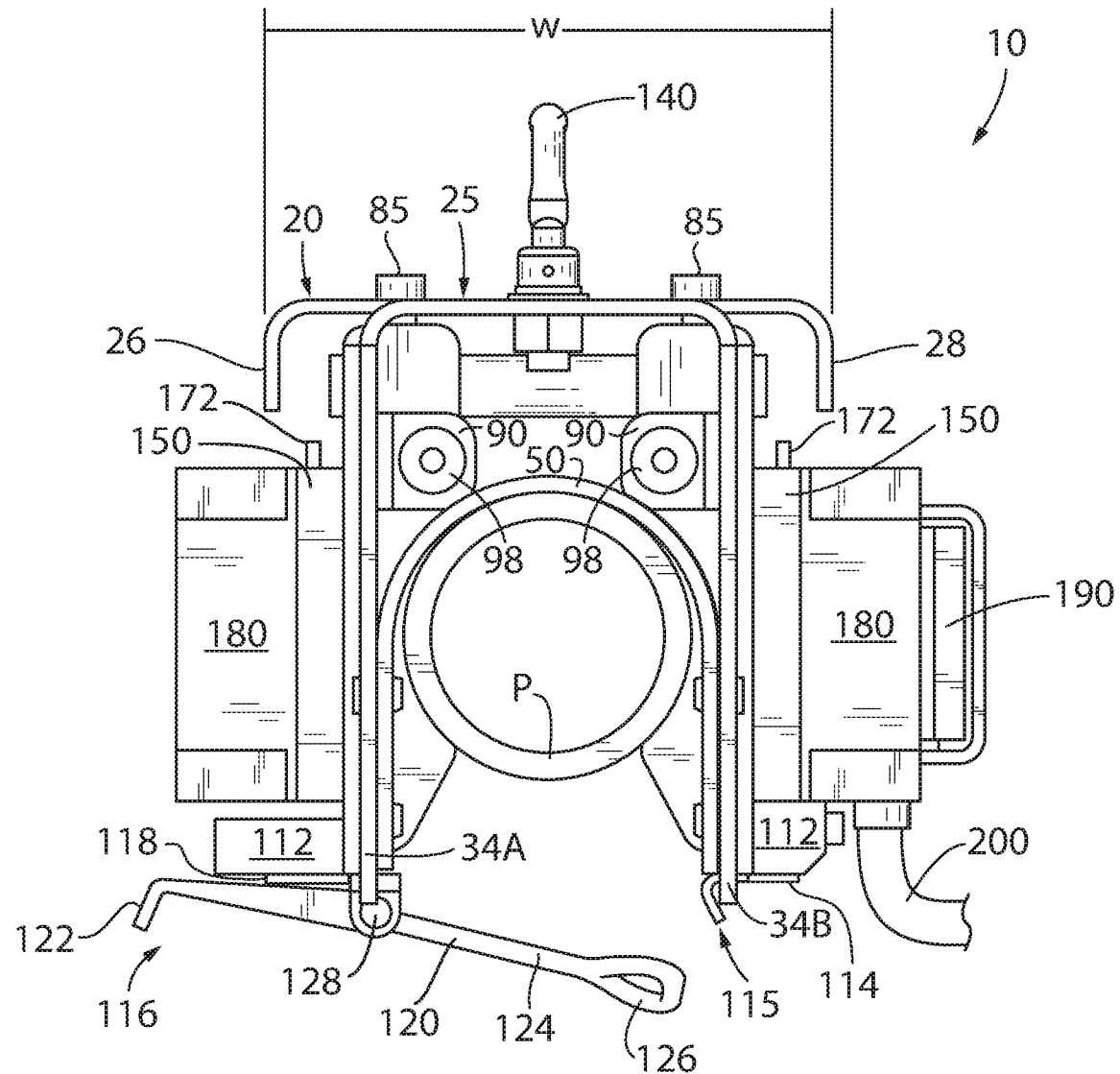
FIG. 2 is a front elevation view of the clamp apparatus of FIG. 1.
Figure 3:
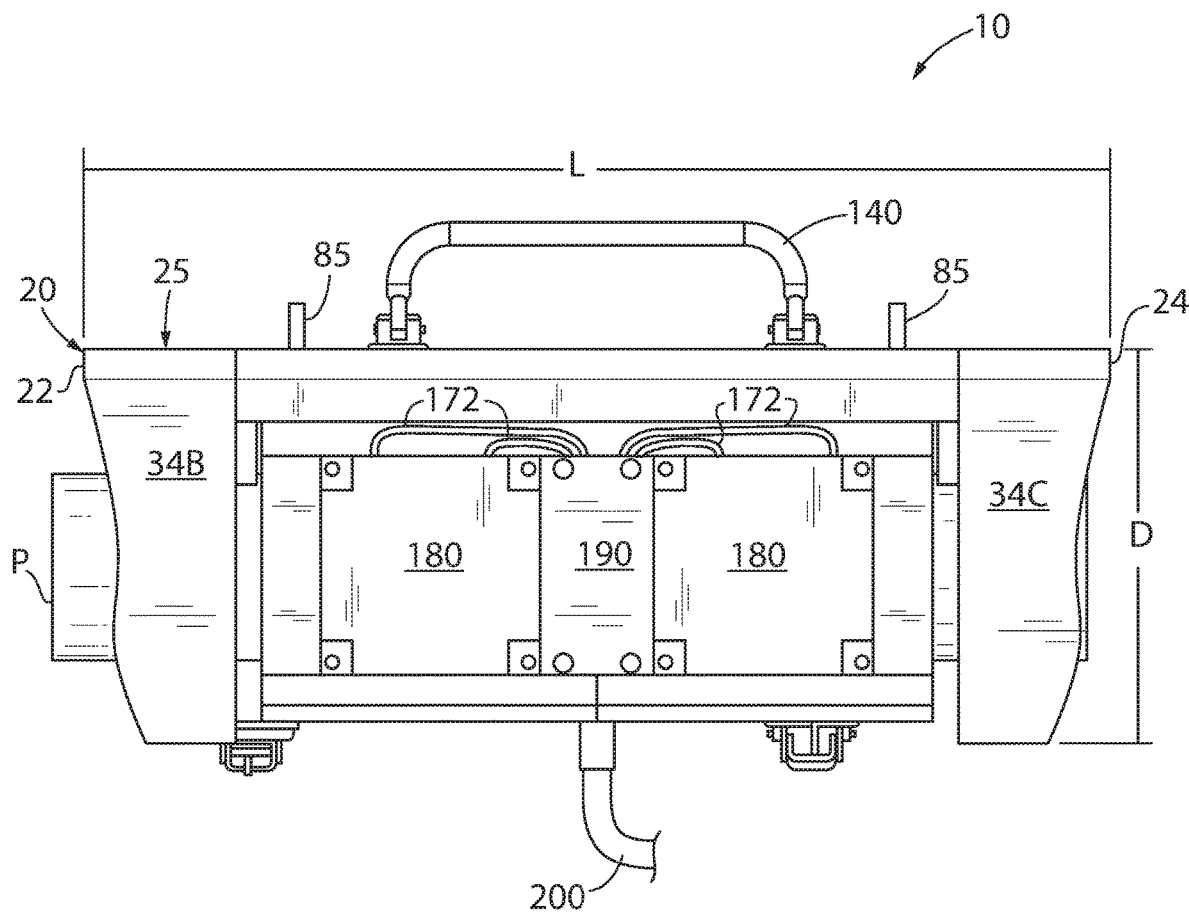
FIG. 3 is a side elevation view of the clamp apparatus of FIG. 1.

Turning initially to FIG. 1, one embodiment of a mobile clamp 10 used to harvest energy from a steam pipe, P, is illustrated. The mobile clamp 10 includes a frame 20, where a first side 25 of the frame is a generally planar surface. The first side 25 extends from a front edge 22 to a back edge 24 and between a first side edge 26 and a second side edge 28 to define the generally planar surface. The frame 20 further includes a leg 34 extending downward from each corner of the first side 25. Each leg 34 is an elongated member extending downward from the first side 25 for a depth, D, (see also FIG. 3) of the frame 20. Each leg 34 is a generally rectangular planar surface oriented orthogonal to the first side. A first, narrow end of each leg 34 is generally aligned with the first side 25 of the frame 20, a second, narrow end of each leg 34 is distal from the first side 25. The two elongated sides of each leg 34 extend between the first and second narrow ends for the depth, D, of the frame 20. A first leg 34A and a second leg 34B are positioned proximate the front edge 22 of the first side 25 and oriented such that an interior planar surface of each leg 34A, 34B faces the interior planar surface of the opposite leg. A second leg 34C and a third leg 34D are positioned proximate the rear edge 24 of the first side 25 and similarly oriented such that an interior planar surface of each leg 34C, 34D faces the interior planar surface of the opposite leg. The distal end of each leg 34 defines a generally open side of the frame 20, where the generally open side of the frame is opposite the first side 25 and is configured to receive an elongated object, such as the steam pipe, within the frame 20. With reference, also to FIGS. 2 and 3, the frame 20 has a width, W, extending between the first side edge 26 and the second side edge. 28, a depth, D, extending between the first side 25 and the distal ends of each leg 34 protruding from the first side, and a length, L, extending from the front edge 22 to the back edge 24.

Figure 4:
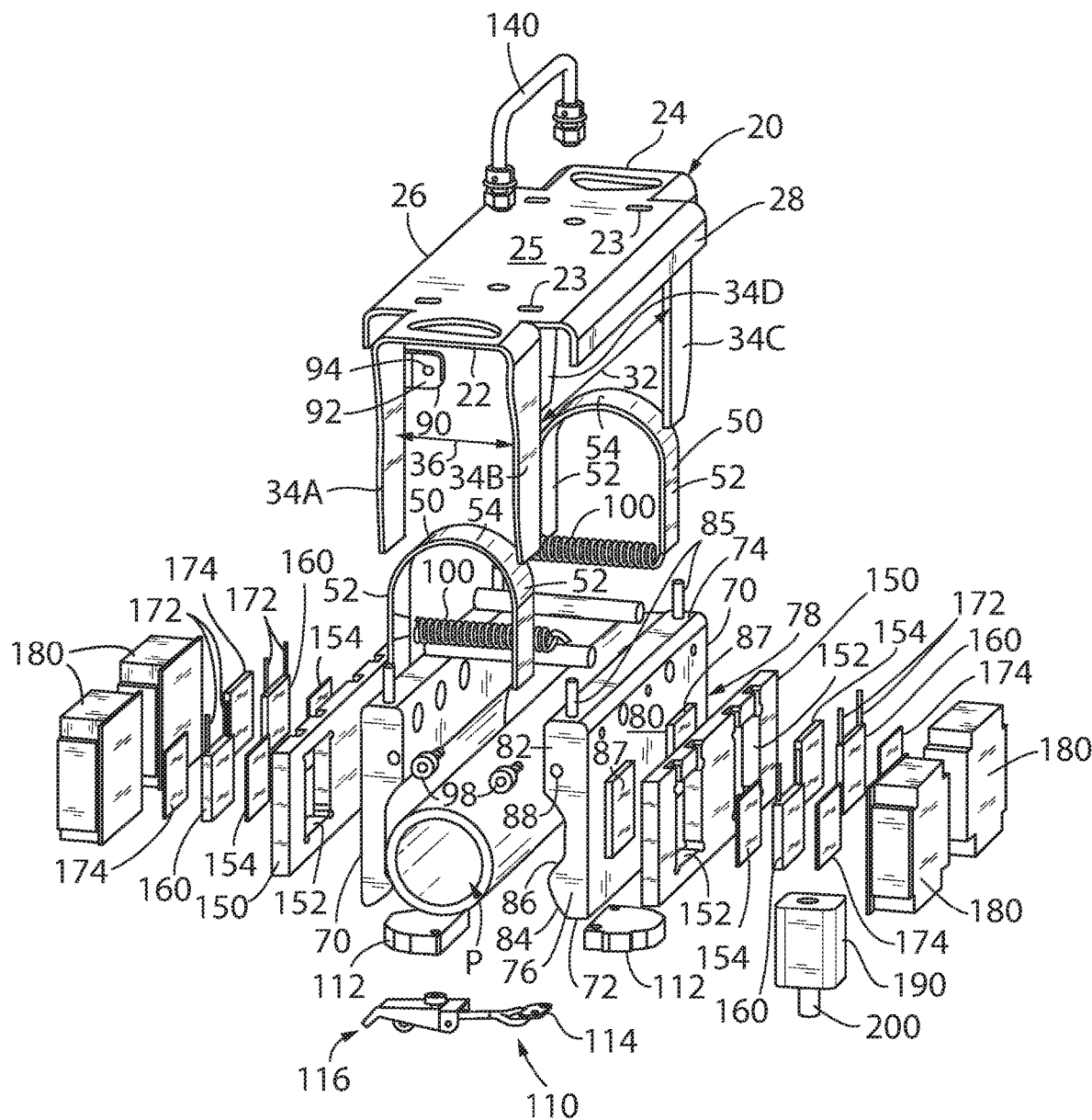
FIG. 4 is an exploded view of the clamp apparatus of FIG. 1.

With reference also to FIG. 4, a frame support member 50 is positioned laterally in an opening 36 between each pair of legs 34 located at the front and rear of the frame 20. Each frame support member 50 includes another pair of legs 52 extending generally parallel to the legs 34 of the frame 20. Each leg 52 for the frame support member 50 is mounted to an interior surface of one lea 34 from the frame 20. An arcuate portion 54 extends between an upper edge of each leg 52 for the support member 50. It is contemplated that the frame support member 50 may be formed, for example, from a single piece of metal, which is initially a rectangle stamped from a piece of sheet material and then formed into the frame support member 50 by stamping or otherwise bending one end of the rectangle down such that it is parallel to but displaced from the other end of the rectangle. The arcuate portion 54 may also serve as a positive stop for an elongated object inserted within the frame 20, defining the limit to which the object may be inserted. Similarly, the arcuate portion 54 may serve as a rest for the mobile clamp 10 if the mobile clamp is placed on an upper surface of an elongated object. The radius of the arcuate portion 54 may be selected such that it complements an outer radius of an elongated object, such as the steam pipe from which it is intended to harvest energy.

A harvester block 70 is positioned longitudinally in an opening 32 between each pair of legs 34 located along the first and second sides of the frame 20. A first harvester block 70 is mounted between the first leg 34A and the fourth leg 34D generally parallel with the first side edge 26 and a second harvester block is mounted between the second leg 34B and the third leg 34C generally parallel with the second side edge 28. Each harvester block 70 has a height extending from a lower edge 72 to an upper edge 74, where the height of the harvester block 70 is less than the height of each leg 34. The length of each harvester block 70 extends from a front edge 76 to a back edge 78 and is less than the length of the opening 32 between a front leg 34 and a rear leg 34 such that the harvester block 70 may pivotally swing between the pair of legs 34. Each harvester block 70 has a lower surface 72 and an upper surface 74. A front surface 76 and a rear surface 78 each extend between the lower and upper surfaces 72, 74. An outer surface 80 has a periphery defined by the lower surface 72, upper surface 74, front surface 76, and rear surface 78 and is facing toward the exterior of the mobile clamp 10. An inner surface 82 has a periphery defined by the lower surface 72, upper surface 74, front surface 76, and rear surface 78 and is facing toward the interior of the mobile clamp 10. A channel 86 extends longitudinally along the inner surface 82 and is configured to receive an elongated object when it is inserted within the frame 20. According to the illustrated embodiment, the channel 86 is an arcuate channel and is configured to receive the steam pipe, P, when it is inserted within the frame 20.

A lower segment 76 of each harvester block 70 may include a tapered segment 84 along the interior surface 82, where the harvester block 70 is thicker toward the channel 86 and thinner toward the lower surface 74. The taper assists with both insertion of the elongated object and orientation of the mobile clamp 10 with respect to the elongated object during insertion. During insertion, the elongated object engages the taper and deflects each harvester block 70 outward. Once the elongated object passes beyond the tapered segment 84 and enters the channel 86, each harvester block 70 is biased back toward the interior of the mobile clamp, such that the harvester block 70 on each side of the elongated object located applies a force to the object positioned between the two blocks, as will be discussed in more detail below.

A pivotal mount 90 is provided for each harvester block 70. According to the illustrated embodiment, the mount 90 is a generally planar tab 92 extending orthogonally from one of the legs 34 into the interior of the mobile clamp toward an opposing leg. The planar tab 92 includes an opening 94 through which a connector 98 is inserted. The connector 98 extends through the opening 94 and into an opening 88 in the harvester block 70. The connector 98 may be, for example, a pin, a shoulder screw, or the like which fastens to the harvester block 70 and rotates within the opening 94 of the mount. It is contemplated that the pivotal mount 90 for each of the harvester blocks may take various other forms without deviating from the scope of the invention. The mount 90 may be, for example, a single connection point located at an end or in the middle of the frame 20. Optionally, the mount 90 may include a pair of tabs 92 where a first tab 92 is located on a front leg 34 and a second tab 92 is located on a rear leg 34. A pair of connectors 98 may similarly be provided and inserted through each opening 94 where one connector 98 engages an opening 88 in a front surface 76 of the harvester block 70 and another connector 98 engages an opening 88 in a rear surface 78 of the harvester block 70.

According to still another embodiment of the invention, it is contemplated that the harvester block 70 may be rigidly mounted along the length, or a portion thereof, of the upper surface 74. The harvester block 70 may be made of a resilient material such that when an initial force is applied, such as the outward, insertion force of the elongated object being inserted within the frame 20, each block deflects outward or is compressed a sufficient amount to allow the elongated object to pass between the two blocks 70 and into the channel 86. Once the insertion force is removed, the resilient material allows each block to elastically return to its initial form and, thereby assist in securing the mobile clamp 10 to the object inserted within. Optionally, a portion of the harvester block 70 located near the upper surface 74 and extending longitudinally along the block 70 may have a reduced thickness, allowing a greater degree of deflection due to the insertion force along the region of reduced thickness. The increased deflection may facilitate insertion of the steam pipe, P, within the mobile clamp 10.

A pair of tabs 85 extend upward from the upper surface 74 of each harvester block 70. Each tab 85 engages an aperture 23 in the first side 25 of the frame 20. The apertures 23 are elongated to allow movement of the tab 85 within the aperture 23 as the harvester block 70 rotates around the pivotal mount 90. The length of each aperture 23 provides a stop, both on outward rotation as the harvester block 70 rotates outward during insertion of an elongated object within the frame and on inward rotation as the harvester block 70 rotates inward, particularly when no object is present within the frame. The tabs 85 within each aperture prevent the two harvester blocks 70 from rotating fully toward each other such that the blocks would contact each other within the interior of the frame. Limiting inward rotation of each harvester block 70 with no object inserted in the frame provides an initial space between the blocks 70 and allows an elongated object, such as the steam pipe, P, to engage the tapered region of the inner surface 82 of the block during initial insertion of the steam pipe within the frame 20.

At least one spring 100 extends between the harvester blocks 70 mounted on each side of the mobile clamp 10, establishing a biasing force toward the center of the clamp 10. According to the illustrated embodiment, a pair of coils springs 100 are provided with a first end of each coil spring 100 mounted to one of the harvester blocks 70 and a second end of each coils spring 100 mounted to the other harvester block 70. The coil springs 100 may stretch straight across the gap between blocks 70 when no object is inserted within the frame 20 and may be deflected around the upper surface of the object when it is inserted within the frame 20. In an initial, state, the coil springs 100 may be in a relaxed state or in a first state of tension, where the first state of tension applies some biasing force on each block 70 towards the center of the clamp 10. As previously discussed, during the first state of tension, the tabs 85 on the top of each block reach the end of travel within the apertures 23 on the first side 25 of the frame 20 preventing further rotation toward the center to of the clamp.

During insertion of the elongated object, the object engages the tapered segment 84 and causes the harvester blocks 70 to spread apart. As a result of this insertion and of deflection of the spring 100 around the upper surface of the object, the spring 100 is extended into a loaded state. In the loaded state, the spring 100 applies a tension force to each harvester block 70 toward the center of the clamp 10, where the tension force in the loaded state is greater than a force applied in the first state of tension. Thus, once the elongated object passes beyond the tapered segment 84 and is positioned between the channels 86 in each block 70, the spring 100 causes the harvester blocks 70 to return back toward the center of the clamp 10. If the diameter of the steam pipe, P, exceeds the space between the two blocks 70 when no object is inserted, the spring 100 further applies a clamping force on the pipe, P, via each of the harvester blocks 70 engaging one side of the pipe.

Once the mobile clamp 10 has been fit around the steam pipe, P, a clamping mechanism 110 is provided to securely retain the mobile clamp on the pipe. The clamping mechanism 110 includes a pair of mounting blocks 112, where one mounting block 112 is affixed to the lower surface 72 of each harvester block 70. A first half of a clamp is then mounted to one mounting block 112 and a second half of a clamp is mounted to the other mounting block 112. According to the illustrated embodiment, the first half of the clamp includes a plate member 114 with a hook 115 at one end. The hook 115 is positioned toward the inner surface 82 of the harvester block to which it is mounted and curves back toward the outer surface. A complementary eye 126 on the second half of the clamp is configured to engage the hook 115 and draw the two harvester blocks 70 together. The second half of the clamp 116 includes a mounting portion 118 configured to be secured by fasteners to the mounting block 112. The second half of the clamp 116 also includes a pivot 128 extending downward from the mounting portion 118 with a first arm 120 extending in one direction from the pivot 128 and a second arm 122 extending in the opposite direction from the pivot. The second arm 122 is a lever arm and is configured to raise or lower the first arm 120 around the pivot 128. The first arm 120 includes a straight portion 124 and the eye portion 126, where the straight portion 124 extends from the pivot and is mounted between the pivot 128 and the eye portion. The lever arm may be used to swing the first arm 120 upwards such that the eye 126 engages the hook 115 of the first mounting portion and then moved upward to pull the eye 126 and the captive hook 115 towards the pivot 128, applying a clamping force between the two harvester blocks 70. It is contemplated that various other clamping mechanisms may be mounted to the mounting blocks 112 or directly to each harvester block 70 and used to pull the two blocks 70 together around the steam pipe, P, when it inserted in the frame, to securely mount the mobile clamp 10 to the pipe without deviating from the scope of the invention.

The harvester block also includes a handle 140 extending from the first side 25 of the frame 20. The illustrated handle 140 is a generally u-shaped member mounted in an upside-down orientation on the first side 25. The handle 140 allows an operator to transport the mobile clamp 10 and to apply a force to the frame 20 to press-fit the frame 20 onto a steam pipe, P.

In operation, the mobile clamp 10 is configured to facilitate transfer of thermal energy from the elongated object, such as a steam pipe, P, that is positioned within the mobile clamp 10 to electrical energy. According to the illustrated embodiment, each harvester block 70 is made of a thermally conductive material to transfer thermal energy from the steam pipe, P, through the block 70. The outer surface 80 of each harvester block 70 includes a pair of raised pads 87 extending outward from the block. Each raised pad 87 is configured to extend through an opening 152 in an insulator 150 mounted to the outer surface 80 of the harvester block 70. The insulator 150 is thermally insulative, inhibiting the transfer of thermal energy through the material. The shape of the opening 152 in the insulator 150 and the shape of each raised pad 87 is configured to receive a thermoelectric device, also referred to herein as a thermoelectric generator, 160. Although illustrated as a rectangular form, the shape of the thermoelectric device 160 and the corresponding shape of the raised pad 87 and opening 152 may take any suitable form without deviating from the scope of the invention.

Figure 5:
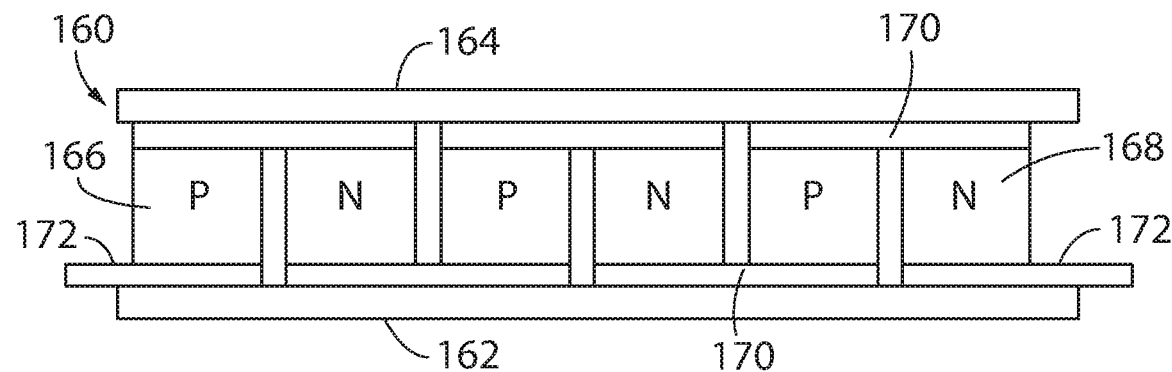
FIG. 5 is a sectional view of one embodiment of a thermoelectric device incorporated in the clamp apparatus of FIG. 1.
Figure 6:
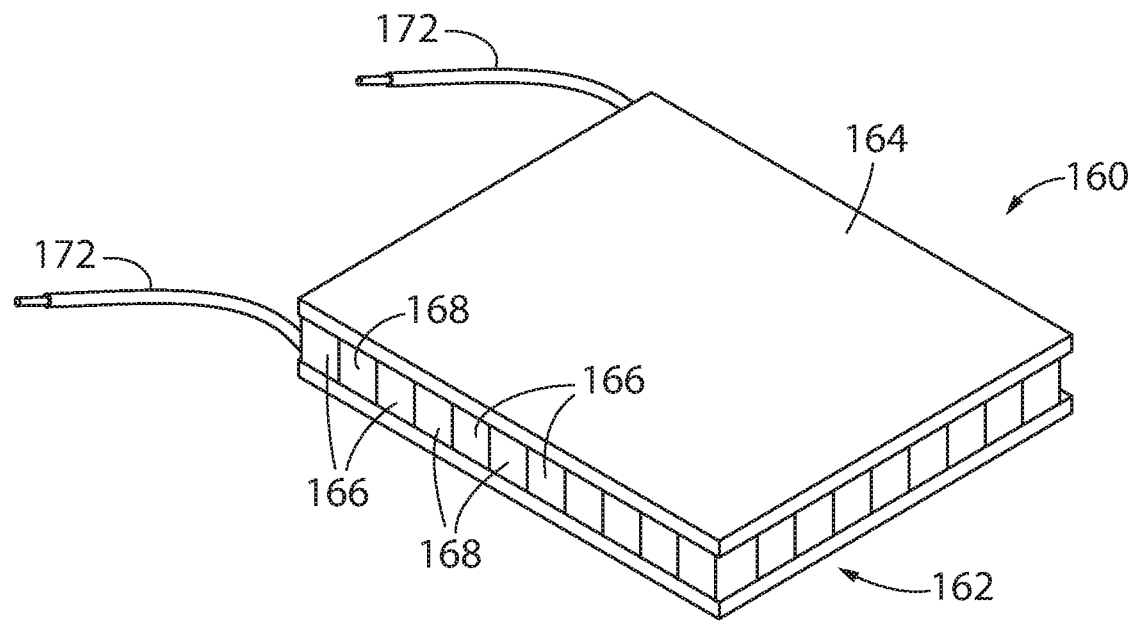
FIG. 6 is a perspective view of the thermoelectric device of FIG. 5.

With reference also to FIGS. 5 and 6, the thermoelectric device 160 generates electrical power as a result of a heat gradient between a first side 162 and a second side 164 of the device. The thermoelectric device 160 is made of two dissimilar materials with poor thermal conductivity between the materials. Thus, one side of the device 160 is warmed from being placed adjacent to a thermal source and the other side of the device 160 remains cool. The thermoelectric device 160 utilizes two different semiconductor materials where one of the materials is a p-type semiconductor 166 and the other material is an n-type semiconductor 168. The p-type and n-type semiconductors 166, 168 are arranged in an alternating fashion between the first side 162 and the second side 164 such that the devices are physically arranged in parallel to each other. Electrical connections 170 are made on alternating sides of the devices such that the semiconductors 166, 168 are electrically connected in series with each other. Electrical leads 172 are provided by which the electrical energy generated within the device may delivered to another device. When a thermal gradient is established between the first side 162 and the second side 164 of the thermoelectric device 160, an electrical voltage is generated across the electrical leads 172 and a DC current is established across the junction of the semiconductors 166, 168 and supplied to an external device.

The conductors 172 are run to a connection block 190 which is used to establish a subsequent electrical connection external to the mobile clamp 10. As illustrated, four thermoelectric devices 160 are included on the mobile clamp 10. The thermoelectric devices 160 on one side of the clamp are connected as a first pair of devices, and the thermoelectric devices 160 on the other side of the clamp are connected as a second pair of devices. Each pair of thermoelectric devices 160 serves as an electrical energy source, creating a redundant power supply from the mobile clamp 10. A cable 200 extending from the connection block 190 establishes an electrical connection between the mobile clamp 10 and an external device.

According to one application of the mobile clamp 10. A sensor, such as a pressure sensor or flow sensor, may be mounted on the steam pipe, P. The energy harvester 10 may be mounted proximate the sensor, and the cable 200 may be connected to a set of terminal blocks or to a plug which, in turn supplies power to the sensor. The energy harvester may similarly supply power to a wireless transmitter located proximate the sensors. As long as steam is being transmitted within the pipes, a temperature differential will exist between the pipe and the ambient environment sufficient for the thermoelectric device 160 to generate electricity. Thus, while the system is operating and requiring data from the sensors, the thermoelectric device 160 is able to generate the required energy both for reading the sensor and power the transmitter to send the information to a central controller.

According to another aspect of the invention, it is contemplated that an electronic device or circuit may be mounted to the mobile clamp 10. The electronic circuit may include, for example, a wireless transmitter configured to transmit data to a remote device. Optionally, the electronic circuit may include a module in communication with a satellite, such as the global positioning system (GPS) to provide a location of the device. The electronic circuit may further include, but is not limited to a processing device, a digital logic circuit, a memory device, a clock circuit, and the like according to an application's requirement. It is further contemplated that the mobile clamp may include an energy storage device such as a capacitor, battery or the like, such that electrical energy generated during periods in which it is not required by other devices on the clamp may be stored and that the stored energy may be used by other devices, for example, for short intervals where the other devices demand may electrical energy than may be generated by the thermoelectric devices 160.

A heat sink 180 may also be provided on the cool side of the thermoelectric device 160 to improve heat transfer away from the cool side of the device and to increase the heat gradient across the device. Increasing the heat gradient across the device increases the amount of electrical energy generated by the thermoelectric device 160. The heat sink 180 is configured to transfer thermal energy from the device on which it is mounted to the ambient environment. The heat sink typically includes fins or other such structures to maximize its surface area and, therefore, maximize contact with the ambient environment, such as the air surrounding the heat sink. Between the heat sink 180 on the second side 164 of the thermoelectric device 160 and the steam pipe, P, on the first side 162 of the thermoelectric device 160 a heat gradient is established across the device.

As also illustrated in FIG. 4, it is contemplated that a thermal interface material (TIM) may be mounted between the thermoelectric device 160 and a surface to which it is mounted. As illustrated, a first TIM 154 is inserted between the thermoelectric device 160 and the raised pad 87 of the harvester block 70, and a second TIM 174 is inserted between the thermoelectric device 160 and the heat sink 180. A TIM is any material that is inserted between two surfaces to enhance the thermal coupling between the two surfaces, including, but not limited to thermal grease, thermal adhesive, thermal gap filler, a thermally conductive pad, or thermal tape.

Although discussed herein with both a harvester block 70 and an insulator 150, it is contemplated that the harvester block 70 may be made of a thermally insulating material. Rather than having raised pads 87 to which the thermoelectric device 160 is mounted, the harvester block 70 may have openings instead. Each thermoelectric device 160 may be mounted to the block within the opening such that the device 160 contacts the steam pipe directly and is, thereby, able to convert the thermal energy from the steam pipe to electrical energy.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A system for harvesting energy, the system comprising:
a frame having a fixed width, a fixed depth, a fixed length, and an open side opposite a close side, wherein the frame is a single continuous piece and comprises:
a top;
a left side extending orthogonally from a first edge of the top; and
a right side extending orthogonally from a second edge of the top, the left side and the right side fixed relative to the top and each other, and wherein:
the open side is configured to receive an elongated object within the frame,
the frame extends longitudinally along the elongated object for the length of the frame,
an interior planar surface of the left side faces an interior planar surface of the right side to receive the elongated object within the frame;
a first block coupled to the frame and extending longitudinally for at least a portion of the length of the frame;
a second block coupled to the frame and extending longitudinally for at least a portion of the length of the frame, wherein the first block and the second block are pivotal relative to the top, the left side, and the right side;
at least one thermoelectric device mounted to one of the first block and the second block;
a first mount located on the frame and displaced from the open side of the frame; and
a second mount located on the frame and displaced from the open side of the frame, wherein:
the first block and the second block operatively engage the elongated object when the elongated object is inserted within the frame to positively retain the frame to the elongated object,
the at least one thermoelectric device is operative to generate electric energy from thermal energy present within the elongated object,
the first block is pivotally connected to the frame by the first mount,
the second block is pivotally connected to the frame by the second mount, and
the first and second block pivot apart from each other to receive the elongated object within the frame, wherein the first and second block each pivot relative to the entire frame.

2. The system of claim 1, further comprising at least one spring connected between the first block and the second block, wherein:
the at least one spring is stretched into a loaded state when the first and second blocks are pivoted apart from each other,
the at least one spring returns to a relaxed state when the first and second blocks are pivoted back towards each other, and
the at least one spring applies a tension force to the elongated object via the first and second blocks to positively retain the frame to the elongated object when the elongated object is inserted within the frame.

3. The system of claim 1 wherein:
the first block includes a first arcuate channel extending longitudinally along an inner surface,
the second block includes a second arcuate channel extending longitudinally along an inner surface,
the frame is configured to receive a pipe as the elongated object, and
the first and second arcuate channels engage the pipe when inserted within the frame to position the frame on the pipe.

4. The system of claim 1, wherein the first block and the second block are each thermally conductive and wherein the thermal energy from the elongated object is transferred through at least one of the first block and the second block to the at least one thermoelectric device.

5. The system of claim 4 further comprising a thermal interface material mounted to a first side of the at least one thermoelectric device between the at one thermoelectric device and the first block or second block to which the at least one thermoelectric device is mounted.

6. The system of claim 5 further comprising:
a second thermal interface material mounted to a second side of the at least one thermoelectric device; and
a heatsink mounted to the second thermal interface material.

7. The system of claim 1 further comprising:
a first thermoelectric device mounted to an outer surface of the first block; and
a second thermoelectric device mounted to an outer surface of the second block, wherein the first thermoelectric device and the second thermoelectric device are each operative to generate electric energy from thermal energy present within the elongated object.

8. The system of claim 7 further comprising:
a connector block;
a first set of electric conductors operatively connected between the first thermoelectric device and the connector block; and
a second set of electric conductors operatively connected between the second thermoelectric device and the connector block, wherein the system provides a redundant power supply via the connector block from the electric energy generated in the first and second thermoelectric devices.

9. A system for harvesting energy, the system comprising:
a single, continuous frame having a first member and an open side opposite the first member, wherein the open side is configured to receive an elongated object within the frame, the frame comprising:
  a top;
  a left side extending orthogonally from a first edge of the top; and
  a right side extending orthogonally from a second edge of the top, the left side and the right side fixed relative to the top and each other, wherein an interior planar surface of the left side faces an interior planar surface of the right side to receive the elongated object within the frame;
a first block pivotally mounted along a first edge of the first member of the frame, wherein the first block includes an inner surface and an outer surface and is pivotable relative to the entire frame;
a second block pivotally mounted along a second edge of the first member of the frame, wherein the second block includes an inner surface and an outer surface and is pivotable relative the entire frame, wherein the inner surfaces of the first block and the second block engage the elongated object when inserted within the frame, and the first block and the second block are pivotal relative to the top, the left side, and the right side;
a first thermoelectric device mounted to the outer surface of the first block;
a second thermoelectric device mounted to the outer surface of the second block, wherein the first thermoelectric device and the second thermoelectric device are each operative to generate electric energy from thermal energy present within the elongated object;
a first mount located on the frame and displaced from the open side of the frame; and
a second mount located on the frame and displaced from the open side of the frame, wherein the first block is pivotally connected to the frame by the first mount, the second block is pivotally connected to the frame by the second mount, and the first and second block pivot apart from each other to receive the elongated object within the frame, wherein the first and second block each pivot relative to the entire frame.

10. The system of claim 9 further comprising at least one spring connected between the first block and the second block, wherein:
the at least one spring is stretched into a loaded state when the first and second blocks are pivoted apart from each other,
the at least one spring returns to a relaxed state when the first and second blocks are pivoted back towards each other, and
the at least one spring applies a tension force to the elongated object via the first and second blocks to positively retain the frame to the elongated object when the elongated object is inserted within the frame.

11. The system of claim 9 wherein:
the first block includes a first arcuate channel extending longitudinally along the inner surface of the first block,
the second block includes a second arcuate channel extending longitudinally along the inner surface of the second block,
the frame is configured to receive a pipe as the elongated object, and
the first and second arcuate channels engage the pipe when inserted within the frame to position the frame on the pipe.

12. The system of claim 9 wherein:
the first block includes a first opening in which the first thermoelectric device is positioned,
the second block includes a second opening in which the second thermoelectric device is positioned,
the first thermoelectric device engages the elongated object through the first opening when the elongated object is inserted within the frame, and
the second thermoelectric device engages the elongated object through the second opening when the elongated object is inserted within the frame.

13. The system of claim 9 wherein the first block and the second block are each thermally conductive and wherein thermal energy from the elongated object is transferred through the first block to the first thermoelectric device and thermal energy from the elongated object is transferred through the second block to the second thermoelectric device.

14. The system of claim 13 further comprising:
a first thermal interface material mounted between a first side of the first thermoelectric device and the outer surface of the first block; and
a second thermal interface material mounted between a first side of the second thermoelectric device and the outer surface of the second block.

15. The system of claim 14 further comprising:
a third thermal interface material mounted to a second side of the first thermoelectric device;
a fourth thermal interface material mounted to a second side of the second thermoelectric device;
a first heatsink mounted to the third thermal interface material; and
a second heatsink mounted to the fourth thermal interface material.

16. The system of claim 9 further comprising:
a connector block;
a first set of electric conductors operatively connected between the first thermoelectric device and the connector block; and
a second set of electric conductors operatively connected between the second thermoelectric device and the connector block, wherein the system provides a redundant power supply via the connector block from the electric energy generated in the first and second thermoelectric devices.

17. The system of claim 1, wherein the first mount is a first pivoting mount, and wherein the second mount is a second pivoting mount.

* * * * *